(12) United States Patent
Sano

(10) Patent No.: US 6,756,731 B1
(45) Date of Patent: Jun. 29, 2004

(54) SEMICONDUCTOR LIGHT EMITTING DEVICE RESISTIBLE TO ULTRAVIOLET LIGHT

(75) Inventor: Takeshi Sano, Niiza (JP)

(73) Assignee: Sanken Electric Co., Ltd., Saitama-pref. (JP)

( * ) Notice: Subject to any disclaimer, the term of this patent is extended or adjusted under 35 U.S.C. 154(b) by 230 days.

(21) Appl. No.: 09/586,656

(22) Filed: Jun. 3, 2000

(30) Foreign Application Priority Data

Jun. 3, 1999 (JP) .......................................... P11-156793

(51) Int. Cl.[7] .............................. H01J 1/62; H01J 63/04; H01L 29/06; H01L 33/00
(52) U.S. Cl. ...................... 313/499; 313/498; 313/501; 257/10; 257/88; 257/98; 257/99; 257/100
(58) Field of Search .......................... 313/499; 257/98, 257/88, 10, 100, 97

(56) References Cited

U.S. PATENT DOCUMENTS

| | | | | |
|---|---|---|---|---|
| 3,805,347 A | * | 4/1974 | Collins et al. ................ 445/24 |
| 4,234,660 A | * | 11/1980 | McKenna et al. ........... 428/356 |
| 4,801,318 A | * | 1/1989 | Toki et al. ..................... 65/396 |
| 5,043,716 A | * | 8/1991 | Latz et al. ..................... 345/82 |
| 5,318,860 A | * | 6/1994 | Yamamura et al. .......... 428/688 |
| 6,274,890 B1 | * | 8/2001 | Oshio et al. ................... 257/98 |
| 6,340,824 B1 | * | 1/2002 | Komoto et al. ................ 257/99 |
| 6,355,946 B1 | * | 3/2002 | Ishinaga ....................... 257/98 |

FOREIGN PATENT DOCUMENTS

| JP | 359208759 A | * | 11/1984 |
| JP | 2924961 | | 7/1999 |
| JP | 3275308 | | 10/2000 |

* cited by examiner

Primary Examiner—Nimeshkumar D. Patel
Assistant Examiner—Matt Hodges
(74) Attorney, Agent, or Firm—Bachman & LaPointe, P.C.

(57) ABSTRACT

A semiconductor light emitting device is provided with a coating material 10 which directly covers the semiconductor light emitting element 2. The coating material 10 comprises a polymetaloxane or a ceramic having a permeability to the ultraviolet light projected from a semiconductor light emitting element 2. The coating material 10 with resistances to ultraviolet light and heat will not be deteriorated even under a high-temperature environment irradiated with ultraviolet light over a long period of time.

18 Claims, 2 Drawing Sheets

SEMICONDUCTOR LIGHT EMITTING DEVICE RESISTIBLE TO ULTRAVIOLET LIGHT

BACKGROUND OF THE INVENTION

1. Field of the Invention

The present invention relates to a semiconductor light emitting device, such as a light emitting diode device, particularly having a semiconductor light emitting element which generates a wavelength-converted light to emit the light having its wavelengths of 550 nm or less to the outside.

2. Description of the Prior Art

Use of a semiconductor light emitting element having a large energy gap allows realization of a semiconductor light emitting device which generates fight at relatively short wavelengths from visible light of short wavelengths to ultraviolet light. A semiconductor light emitting element for generating light having such wavelengths, includes nitrogen gallium compound semiconductors, such as GaN, GaAlN, InGaN and InGaAlN which can be utilized to provide a new solid-state ultraviolet light source to offer a variety of advantages including small size, low power consumption, and long life.

Figure 4:
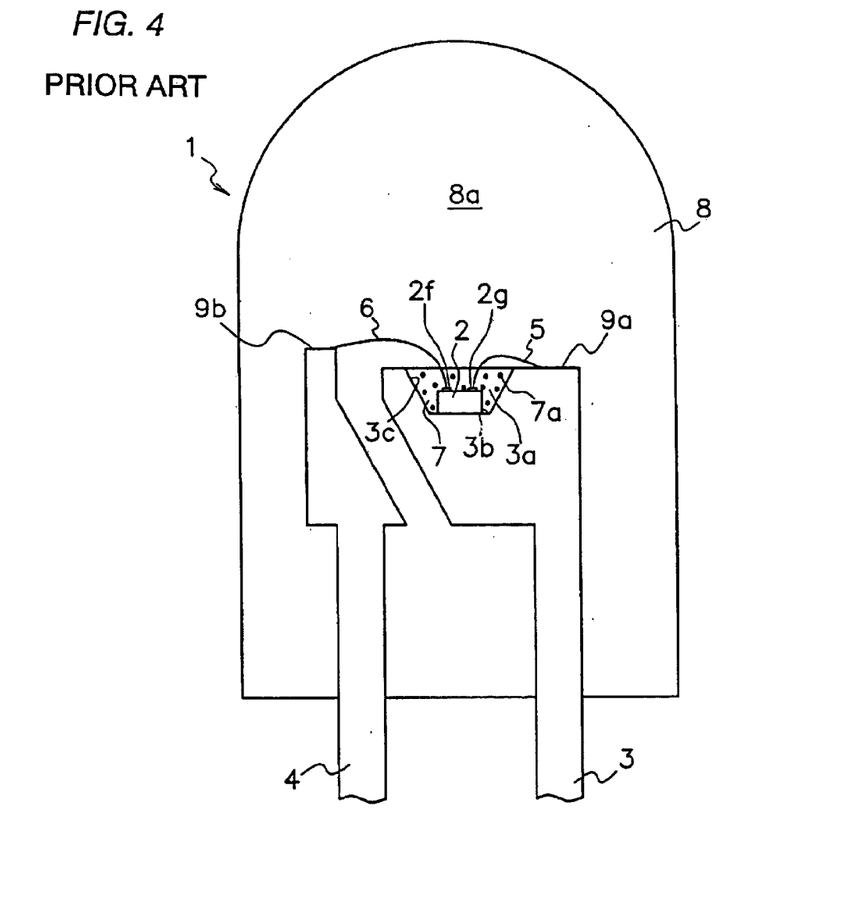
FIG. 4 shows a sectional view of a prior art light emitting diode device.

FIG. 4 shows a sectional view of a prior art light emitting diode device 1 which utilizes a fluorescent substance 7a for converting the wavelength of the light projected from a light emitting diode chip 2. As shown in FIG. 4, the light emitting diode chip 2 is secured to a bottom surface 3b of a concavity 3a formed in a first external terminal 3 as a cathode lead. A cathode electrode 2g formed on the light emitting diode chip 2 is connected to a first wire connection 9a of the first external terminal 3 by means of a first lead wire 5. Also, an anode electrode 2f formed on the light emitting diode chip 2 is connected to a second wire connection 9b of a second external terminal 4 as an anode lead by means of a second lead wire 6. The light emitting diode chip 2 secured on the concavity 3a is covered with a light permeable protective plastic material 7 filled in the concavity 3a with fluorescent substance 7a blended in the plastic material 7. Moreover, a light permeable plastic encapsulant 8 encapsulates the light emitting diode chip 2, concavity 3a and first and second wire connections 9a, 9b of the first and second external terminals 3 and 4, and lead wires 5, 6.

When a voltage is applied across the first and second external terminals 3 and 4 of the light emitting diode device 1, the light emitting diode chip 2 is activated to generate a light which passes through the protective plastic material 7, and then is reflected on a side wall 3c of the concavity 3a formed in the first external terminal 3. Subsequently, the light passes through the transparent plastic encapsulant 8 and is then released out of the light emitting diode device 1. Some of the light is projected from a top of the light emitting diode chip 2, and is directly passed through the protective material 7 and plastic encapsulant 8 without the reflection on the side wall 3c of the concavity 3a before the release to the outside of the light emitting diode device 1. The plastic encapsulant 8 is formed with a lens portion 8a at the top so that the lens portion 8a converges the light passed through the plastic encapsulant 8 for increased directivity. Upon passing through the protective plastic material 7, the light projected from the light emitting diode chip 2 is converted into the light of different wavelength by the fluorescent substance 7a mixed into the protective plastic 7 before the release. Accordingly, the light emitting diode device 1 releases light different in wavelength from the light projected out of the light emitting diode chip 2.

Generally, a semiconductor light emitting element is covered with a plastic sealer or plastic encapsulant 8 which comprises an organic polymeric compound in which elements such as carbon, hydrogen, oxygen and nitrogen are linked together in the mesh form. In this case, it is known that the bonds of the organic polymer are cut, when the plastic sealer or epoxy resin encapsulant 8 of the diode device is irradiated with ultraviolet light or the like, resulting in deterioration of various optical or chemical characteristics of the plastic sealer. For example, a GaN (gallium nitride) light emitting diode chip generates ultraviolet light having wavelengths up to approximately 365 nm, and therefore, when irradiated with ultraviolet light, the plastic sealer 8 is gradually yellowed or discolored, starting from the periphery with the highest light intensity of the light emitting diode chip 2. Accordingly, the visible light generated by the light emitting diode chip 2 is absorbed by the colored area, causing the light to be decayed. Also, the discoloration results in the deterioration, reduced moisture resistance and increased ion permeability of the plastic sealer 8 so that contamination or undesirable ions can enter from outside through the plastic sealer 8 into the light emitting diode chip 2, which results in the deterioration of the diode chip 2 itself and synergistically decreased intensity of emission light for the light emitting diode device 1.

In addition, when a light emitting diode chip of GaN (gallium nitride) has a high forward voltage, it generates the high power loss even with a relatively low forward current, and the considerably elevated temperature in the diode chip 2 in operation. It is generally known that a plastic material is gradually deteriorated to be yellowed or discolored when subjected to heat or a high temperature. Therefore, if a GaN light emitting diode chip is assembled to prepare a prior art light emitting diode device, the plastic material is gradually yellowed or discolored, starting from the area contacting with the high-temperature light emitting diode chip, as light of short wavelength is projected from the light emitting diode chip, thereby causing the degradation in quality of the appearance and gradually lowered emission light intensity of the light emitting diode device. Thus, the prior art light emitting diode device causes a limited and reduced number of selectable types of material, a decrease in reliability, imperfection of light conversion function and a rise in product price.

In view of the above-mentioned fact that the ultraviolet light causes the debasement of the plastic sealer for a short period of time with the reduced light emission efficiency, a hermetically sealed structure has been proposed for some of the light emitting devices which include an outer container for hermetically sealing the semiconductor light emitting element in the container to completely insulate it from the external atmosphere, and an inactive or stable sealing gas such as nitrogen filled in the container.

Although the hermetically sealed structure does not cause the deterioration of the plastic sealer, it raises a problem of the final expensive products because it requires costly materials and a relatively complicated process for manufacture. In addition, because the container is filled with an inactive gas of its refractive index greatly different from that of the gallium nitride compound semiconductor, disadvantageously a reflection plane is formed at the boundary between the gallium nitride compound semiconductor and the inactive gas. Consequently, a defect is presented in that the light projected from the semiconductor light emitting element is repetitively reflected at the boundary between the gallium nitride compound semiconductor and the inactive gas, resulting in the decayed or attenuated light and the lowered light emission efficiency.

Further, various problems in practical use have been presented with the conventional light emitting diode device 1 which comprises the light emitting diode chip 2 surrounded by the protective plastic material 7 with the fluorescent substance 7a contained therein, and the plastic encapsulant 8 for surrounding the whole of the diode chip 2 and plastic material 7. Firstly, when the protective plastic 7 and the plastic encapsulant 8 do not always have a sufficient environmental resistance, only a specific type of the fluorescent substance 7a can be compounded into the protective plastic material 7. Generally, a plastic material is permeable to moisture which permeates the plastic material with the lapse of time, when it is left in a high humidity atmosphere. In this case, the permeating moisture may cause decomposition or change in quality of some fluorescent substances if they have their poor resistance to moisture resulting in the reduction or loss of the light wavelength conversion capability. For example, the well-known typical fluorescent substance 7a of calcium sulfide cannot be used with the conventional light emitting diode device 1 because it is hydrolyzed by moisture.

In addition, not only moisture but also foreign matter ions, such as sodium and chlorine, permeate the plastic material, and have a harmful effect on the light emitting diode chip 2. Therefore, although the light emitting diode device 1 is manufactured in a clean environment, if it is left in an atmosphere containing foreign matter ions, it would present a serious problem that those ions gradually permeate the inside of the plastic material resulting in the deteriorated electrical characteristics of the light emitting diode chip 2. Particularly, it is a critical problem that not a few of the organic fluorescent substances available are chemically unstable due to presence of undesirable and harmful free foreign matter ions. Therefore, the conventional light emitting diode device 1 cannot utilize such organic fluorescent substances.

Another problem is that the plastic encapsulant is debased by irradiation of the short-wavelength light, such as ultraviolet light generated from the light emitting diode chip 2. As above-mentioned, since the protective plastic material 7 and the plastic sealer 8 comprises an organic polymeric compound of elements such as hydrogen, oxygen and nitrogen linked together in the mesh form, it is known that the bonds of the organic polymeric compound are cut when ultraviolet light is projected on them, which results in deterioration of the various optical and chemical characteristics. For example, a blue light emitting diode chip of GaN (gallium nitride) may have an emission light component in the ultraviolet wavelength region of 380 nm or less, in addition to the visible light component so that the plastic encapsulant is gradually yellowed or discolored, starting from the periphery with the high light intensity of the light emitting diode chip, and thus, the visible light generated by the light emitting diode chip would be decayed due to absorption by the colored area. Further, the deterioration of the plastic encapsulant causes the lowered resistance to moisture and the increased ion permeability to thereby damage the light emitting diode chip 2 and synergistically decrease the emission light intensity of the light emitting diode device 1.

Still further, there are great restrictions on selection of the fluorescent substance and the light emission characteristics of the light emitting diode device because it cannot make use of a light emitting diode chip for generating ultraviolet light, and this is the third problem. Many developments and improvements have been made since old days on the fluorescent substances excited by the ultraviolet light for use in a fluorescent or mercury lamp or the like so that a number of fluorescent substances are put to practical use at present because they have a variety of wavelength distributions of emission light, and are inexpensive and high in light conversion efficiency. If a diode chip for emitting ultraviolet light can be combined with fluorescent substances excited by the ultraviolet light, it would be expected to establish light emitting diode devices which are still more brighter and greatly vary in color tone. However, the conventional light emitting diode device cannot utilize ultraviolet light emitting diode chips because the plastic materials and fluorescent substance may be deteriorated by the ultraviolet light although the fluorescent substances are excellent in light conversion efficiency.

The fourth problem is that the light projected from the light emitting diode chip is decayed when passed through the plastic encapsulant which is yellowed or discolored because of its low heat resistance. As stated above, the GaN (gallium nitride) blue light emitting diode chip of a type for example with its high forward voltage, produces the high power loss even with a relatively low forward current, and the chip temperature is considerably raised in service. It is known that a plastic material is gradually deteriorated to be yellowed or discolored when heated to a high temperature. Therefore, if a GaN light emitting diode chip is used with a conventional light emitting diode device, the plastic material is gradually yellowed or discolored, starting from the area contacting with the light emitting diode chip of elevated temperature, thereby causing the gradual deteriorated quality in appearance and the reduced emission light intensity of the light emitting diode device 1. In this way, in the conventional light emitting diode device, the above-mentioned problems would be presented by compounding a fluorescent substance into the plastic material, resulting in a reduced number of selectable types of materials, a decrease in reliability, imperfection of light conversion function, and a rise in product price.

An object of the present invention is to provide a semiconductor light emitting device which has excellent resistances to environment and ultraviolet light.

Another object of the present invention is to provide a semiconductor light emitting device resistible to heat.

SUMMARY OF THE INVENTION

The semiconductor light emitting device according to the present invention comprises a base (3, 4, 11), a semiconductor light emitting element (2) secured to the base (3, 4, 11), and a coating material (10) for covering the semiconductor light emitting element (2) wherein the coating material (10) is a light permeable polymetaloxane or ceramic formed from a metal alcoxide, a ceramic precursor polymer or the like. Unlike the organic plastic material, the coating material (10) will not be deteriorated under an elevated temperature environment in which ultraviolet light is projected thereon over a long period of time because the coating material (10) is a polymetaloxane or a ceramic which offers resistances to ultraviolet light and heat when irradiated with such as ultraviolet light of short-wavelength.

In an embodiment of the present invention, the coating material (10) is in the state of highly pure glass and does not have an ill effect on the characteristics of the semiconductor light emitting element (2) because the coating material (10) has an extremely small amount of impurities, compared to low-melting point glass, etc. containing boron, lead oxide, etc. Further, the coating material (10) is in the state of highly heat-resistant glass which, therefore, does not cause reduc- tion in light permeability due to yellowing and the like. The coating material comprises the glass formed based on the metaloxane bond, or a ceramic formed from a ceramic precursor.

The semiconductor light emitting device is prepared by securing the semiconductor light emitting element (2) to the base (3, 4, 11); applying on the semiconductor light emitting element (2) a filler of the polymetaloxane sol obtained from the metal alcoxide or the ceramic precursor polymer; and then, drying and heat treating the filler to form the coating material (10). Because the coating material (10) is formed by the sol-gel technique for metal alcoxide or from the ceramic precursor polymer, it is vitrified at a low temperature to provide a transparent or clear noncrystalline metal oxide.

With use of a metal alcoxide, a type of organic metal compound as a starting material in the sol-gel technique, the solution is hydrolyzed and polymerized with condensation to form a sol, and further the reaction is advanced by moisture in air etc. for gelation to obtain a solid metal oxide. For example, when tetraethoxysilane as a metal alcoxide of silicon is used in the process for forming a silica glass membrane, the tetraethoxysilane is dissolved in a solvent such as alcohol; a catalyst such as an acid and a small amount of water are added to the mixture; and the solution is thoroughly agitated to form a polysiloxane sol in the liquid state in accordance with the following reaction formulae:

Hydrolysis reaction: $Si(OC_2H_5)_4 + 4H_2O \rightarrow Si(OH)_4 + 4C_2H_5OH$

Dehydration-condensation reaction: $nSi(OH)_4 \rightarrow [SiO_2]_n + 2nH_2O$

A number of $SiO_2$ (silica) molecules of the polysiloxane sol generated as a result of the above-mentioned reactions are bonded to one another to form a polymer, and the fine particles of this polymer are dispersed in the alcohol solution. When the polysiloxane 801 is applied to the base (3, 4, 11) and dried, the volume of the sot contracts or shrinks because the solvent, water and ethyl alcohol produced by the reaction are evaporated, and as a result the residual OH groups at the ends of adjacent polymers are bonded to each other due to the dehydration reaction with condensation to cause the coating to be gelled or solidified. Subsequently, the gel coating obtained is baked to strengthen the bonds between the polysiloxane particles and finally form a gel coating having a high mechanical strength.

The coating material (10) has a permeability to the light projected from the semiconductor light emitting element (2), and contains a fluorescent substance (10a) which absorbs the light projected from the semiconductor light emitting element (2), and converts it into light different in emission light wavelength. The coating material (10) is formed by baking the coating agent comprising a metal alcoxide, such as tetramethoxysilane and tetraethoxysilane, or a ceramic precursor polymer, such as perhydropoly-silazane, and tightly and strongly adheres to the semiconductor light emitting element (2) and the external terminals (3, 4). The light emitted from the semiconductor light emitting element (2) can be converted into light having a desired emission light wavelength by means of the fluorescent substance (10a) in the coating material (10) for surrounding the semiconductor light emitting element (2), and the light is released to the outside through the coating material (10).

The semiconductor light emitting element (2) is secured to the base (3, 4, 11) through the adhesive (12) formed of an organic resin or a polymetaloxane. Particularly, the adhesive formed of a polymetaloxane is hardly deteriorated when irradiated with short-wavelength light such as ultraviolet light.

A gallium nitride semiconductor light emitting element (2) efficiently generates light at short wavelengths of 365 nm to 650 nm to form a to semiconductor light emitting device with the high emission light luminance and high reliability. Since short-wavelength light tends to particularly deteriorate prior art plastic coating material (7) and plastic adhesive, the present invention would give rise to a great effect for preventing deterioration of the coating material (10) and adhesive (12). The fluorescent substance (10a) absorbs a part of the light from the semiconductor light emitting element (2), and converts the wavelength from short to long at a high light-conversion efficiency. The base (3, 4, 11) comprises first and second external terminals (3, 4), and the semiconductor light emitting element (2) comprises the electrodes (2f, 2g) electrically connected respectively to the first and second external terminals (3, 4).

The coating material (10) which is permeable to the light projected from the semiconductor light emitting element (2) covers the semiconductor light emitting element (2), and the end portions of the first external terminal (3) and the second external terminal (4) in the vicinity of the semiconductor light emitting element (2). The coating material (10) is formed by solidifying a coating agent which comprises a solution produced by hydrolyzing and polymerizing a metal alcoxide by the sol-gel technique, a solution containing a ceramic precursor polymer, or a combination of these solutions.

Since the coating material (10) has resistances to ultraviolet light and heat, the utilization of the coating material (10) can surely prevent yellowing and discoloring of the coating material (10) itself and the encapsulant (8) for covering the coating material (10), and also prevent the optical characteristics of the semiconductor light emitting device from being deteriorated, so that the resistance to environment can be maintained by the double covering structure of the encapsulant (8) and the coating material (10).

In an embodiment of the present invention, the coating material (10) is formed by drying and baking the coating agent to tightly and strongly adhere to the semiconductor light emitting element (2). Formed in either end portion of the first and second external terminals (3, 4), is a concavity (3a) with the bottom (3b) on which the semiconductor light emitting element (2) is secured together with the coating material (10).

The metal alcoxide is selected from the silicontetra alcoxides, such as $Si(OCH_3)_4$, $Si(OC_2H_5)_4$, $Si(i-OC_3H_7)_4$, and $Si(t-OC_4H_9)_4$, the single metal alcoxides, such as $ZrSi(OCH_3)_4$, $Zr(OC_2H_5)_4$, $Zr(OC_3H_7)_4$, $Si(OC_4H_9)_4$, $Al(OCH_3)_3$, $Al(OC_2H_5)_3$, $Al(iso-OC_3H_7)_3$, $Al(OC_4H_9)_3$, $Ti(OCH_3)_4$, $Ti(OC_2H_5)_4$, $Ti(iso-OC_3H_7)_4$, and $Ti(OC_4H_9)_4$, the two-metal alcoxides, such as $La[Al(iso-OC_3H_7)_4]_3$, $Mg[Al(iso-OC_3H_7)_4]_2$, $Mg[Al(sec-OC_4H_9)_4]_2$, $Ni[Al(iso-OC_3H_7)_4]_2$, $Ba[Zr_2(C_2H_5)_9]_2$, and $(OC_3H_7)_2Zr[Al(OC_3H_7)_4]_2$, and the multi-metal alcoxides. The ceramic precursor polymer is perhydropolysilazane. The coating material (10) is formed by baking the metal alcoxide or the ceramic precursor polymer at a temperature lower than the melting point of the semiconductor light emitting element (2). The coating material (10) is a clear or transparent coating layer for example a solid glass layer based on the metaloxane bond. The metal alcoxide is expressed by the general formula $M(OR)_n$, where M is at least one type of metal selected from the group comprising silicon (Si), aluminum (Al), zirconium (Zr), and titanium (Ti); R is a homogeneous or heterogeneous saturated or unsaturated aliphatic hydrocarbon group having 1 to 22 carbon atoms; and n is the number equivalent to the metal valency.

The electrodes (2f, 2g) formed on the top of the semiconductor light emitting element (2) are electrically connected respectively to the first and second external terminals (3, 4) by means of the first and second lead wires (5, 6); the coating material (10) covers the semiconductor light emitting element (2), the electrodes (2f, 2g) and the end portions of the first and second lead wires (5, 6) connected to the electrodes (2f, 2g) of the semiconductor light emitting element (2); and the coating material (10) tightly and strongly adheres to the end portions of the first and second lead wires (5, 6).

In another embodiment of the present invention, a concavity (3a) is formed in one principal surface of the insulative substrate (11) for constituting the base (3, 4, 11); the first and second external terminals (3, 4) are formed to extend in the directions opposite to each other along the one principal surface of the insulative substrate (11); and the semiconductor light emitting element (2) is secured to either of the first and second external terminals (3, 4) at the bottom (3b) of the concavity (3a). The first and second external terminals (3, 4) extend from one principal surface of the insulative substrate (11) to the other principal surface along the sides.

The coating material (10) is formed not to extend from the upper end of the concavity (3a) in order to prevent false lighting of a deactivated semiconductor light emitting device adjacent to an activated semiconductor light emitting device. The light projected from the semiconductor light emitting element (2) is passed through the coating material (10) and the encapsulant (8) of plastic material, and thereafter is released out of the encapsulant (8). As the light projected from the semiconductor light emitting element (2) reaches the fluorescent substance (10a) in the glass layer of the coating material (10), the light component is subjected to wavelength-conversion in the coating material (10) so that the converted light is mixed with the light component without wavelength-conversion from the semiconductor light emitting element (2) to give off the mixed light to the outside through the plastic encapsulant (8).

An additive or additives may be compounded into the coating material (10) such as a light absorption substance for absorbing emitted light having a specific wavelength, a light scattering substance (10b) for scattering the light emitted from the semiconductor light emitting element (2) or a binder (10b) for preventing the coating material (10) from being cracked.

The method for manufacturing the semiconductor light emitting device according to the present invention comprises the steps of forming a concavity (3a) in the base (3, 4, 11); securing the semiconductor light emitting element (2) to the bottom (3b) of the concavity (3a) and electrically connecting the electrodes (2f, 2g) formed on the semiconductor light emitting element (2) to the first and second external terminals (3, 4); pouring the coating agent into the concavity (3a) for covering the semiconductor light emitting element (2), the electrodes (2f, 2g) and the end portions of the first and second lead wires (5, 6) connected to the electrodes (2f, 2g), the coating agent having a permeability to the light projected from the semiconductor light emitting element (2), and the coating agent comprising a solution produced by hydrolyzing and polymerizing a metal alcoxide by the sol-gel technique, a solution containing a ceramic precursor polymer or a combination of these solutions; and finally baking the coating agent to form the coating material (10) for covering the semiconductor light emitting element (2).

The embodiments of the present invention may comprise any one of the steps of pouring the solution containing a metal alcoxide into the concavity (3a); forming the base (11) of an insulative substrate; sealing the coating material (10) with the encapsulant (8); tightly and strongly applying the coating material (10) to the semiconductor light emitting element (2) and the first and second external terminals (3, 4); forming a concavity (3a) in either end portion of the first and second external terminals (3, 4) used as the base (3, 4, 11); or baking the coating agent at a temperature lower than the melting point of the semiconductor light emitting element (2) to form the coating material (10). Also, the method may further comprise forming a concavity (3a) in one principal surface of the insulative substrate (11) as the base (3, 4, 11); and forming the first and second external terminals (3, 4) extending in the directions opposite to each other along the one principal surface of the insulative substrate (11). The method may comprise a process of electrically connecting the electrodes (2f, 2g) of the semiconductor light emitting element (2) to the first and second external terminals (3, 4) by means of the first and second lead wires (5, 6).

One embodiment of the present invention comprises the process of forming a concavity (3a) in either end portion of the first and second external terminals (3, 4); attaching the semiconductor light emitting element (2) to the bottom (3b) of the concavity (3a); electrically connecting the electrodes (2f, 2g) formed on the semiconductor light emitting element (2) to the first and second external terminals (3, 4) by means of the lead wires (5, 6); pouring the coating agent into the concavity (3a) to cover the semiconductor light emitting element (2), the electrodes (2f, 2g) and the end portions of the lead wires (5, 6) connected to the electrodes (2f, 2g), the coating agent having a permeability to the light projected from the semiconductor light emitting element (2), the coating agent comprising a metal alcoxide or a ceramic precursor polymer and containing a fluorescent substance which absorbs the light projected from the semiconductor light emitting element (2) and converts it into light different in emission light wavelength; and further sealing the coating material (10) with the encapsulant (8), the coating material (10) tightly and strongly adhering to the semiconductor light emitting element (2) and the external terminals (3, 4).

Another embodiment of the present invention comprises the process of forming a concavity (3a) in one principal surface of the insulative substrate (11) for constituting the base (3, 4, 11); forming the first and second external terminals (3, 4) extending in the directions opposite to each other along the one principal surface of the insulative substrate (11); attaching the semiconductor light emitting element (2) to either of the first and second external terminals (3, 4) at the bottom (3b) of the concavity (3a); electrically connecting the electrodes (2f, 2g) formed on the semiconductor light emitting element (2) to the pair of external terminals (3, 4); pouring the coating agent into the concavity (3a) to cover the semiconductor light emitting element (2), the electrodes (2f, 2g) and the end portions of the lead wires (5, 6) connected to the electrodes (2f, 2g) by the coating agent, the coating agent comprising a metal alcoxide or a ceramic precursor polymer, having a permeability to the light projected from the semiconductor light emitting element (2), and containing a fluorescent substance which absorbs the light projected from the semiconductor light emitting element (2), and converts it into light different in emission light wavelength; baking the coating agent at a temperature lower than the melting point of the semiconductor light emitting element (2) to form the coating material (10) which tightly and strongly adheres to the semiconductor light emitting element (2) and the external terminals (3, 4); and finally sealing the coating material (10) with the plastic encapsulant (8).

DESCRIPTION OF THE PREFERRED EMBODIMENTS

Figure 2:
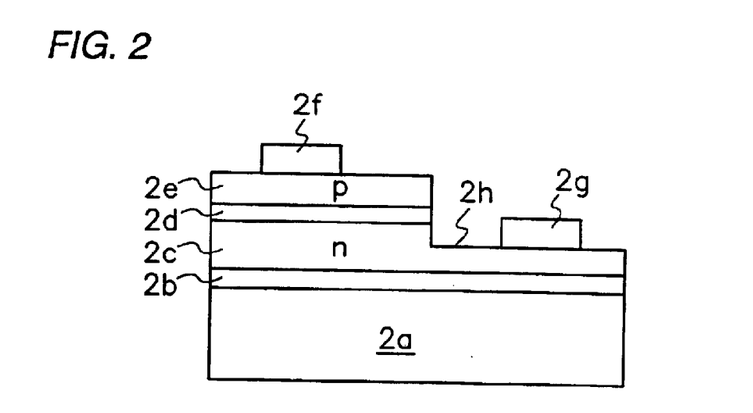
FIG. 2 illustrates a sectional view of a semiconductor light emitting element.
Figure 3:
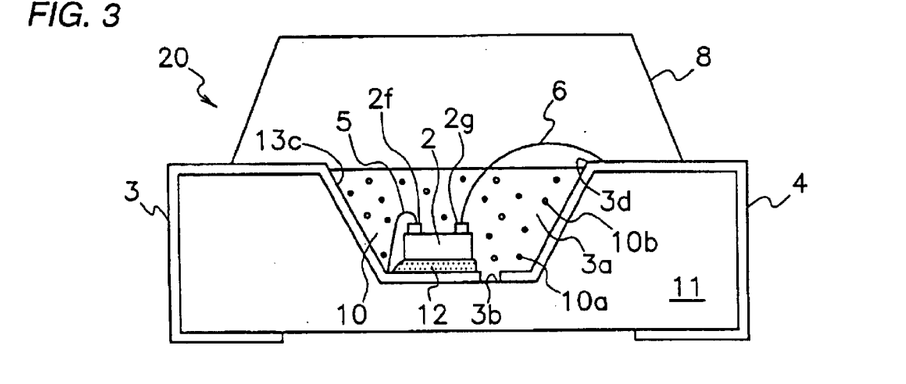
FIG. 3 demonstrates an embodiment of the present invention applied to a chip-type light emitting diode device.

Hereinbelow, embodiments of the present invention will be described with reference to FIGS. 1 to 3 applied to a light emitting diode device comprising a gallium nitride compound. In the embodiments as shown in FIGS. 1 to 3, the same reference numerals are applied to any portions same as or similar to portions shown in FIG. 4.

Figure 1:
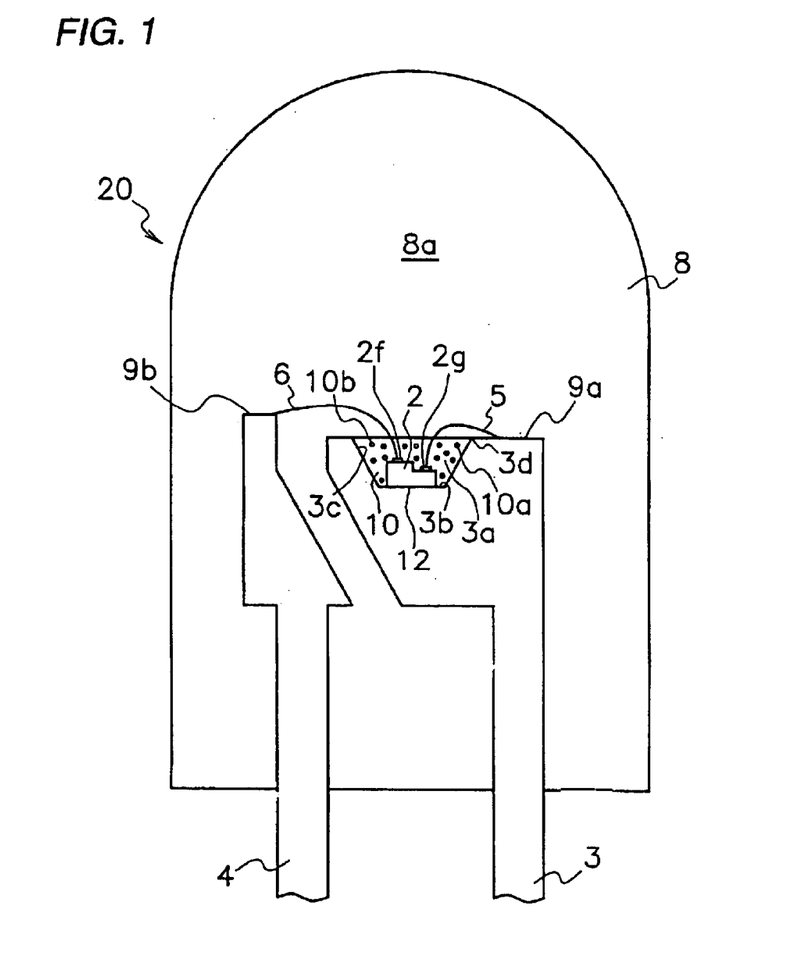
FIG. 1 is a sectional view of a semiconductor light emitting device according to the present invention applied to a light emitting diode device.

As shown in FIG. 1, a light emitting diode device 20 according to the present embodiment comprises a first external terminal 3 which has a concavity or dish-shaped electrode 3a and a first wire connection 9a formed in one end portion of the first external terminal 3; a second external terminal 4 which has a second wire connection 9b formed in one end portion of the second external terminal 4; a light emitting diode chip 2 secured to the bottom surface of the concavity 3a; a first lead wire 5 connected across the first wire connection 9a and the light emitting diode chip 2; a second lead wire 6 connected across the second wire connection 9b and the light emitting diode chip 2; a coating material 10 filled in the concavity 3a for covering the light emitting diode chip 2; and a plastic encapsulant 8 for covering the outside of the coating material 10. The first and second external terminals 3, 4 are configured as a base from a well-known lead frame, and the concavity 3a is formed by crushing the first external terminal 3 in the longitudinal direction.

The light emitting diode chip 2 comprises a gallium nitride compound semiconductor which emits light at wavelengths of 365 nm to 550 nm, and in the present embodiment, employs a GaN blue light emitting diode chip of approximately 440 nm to 470 nm in emission light peak wavelength. A gallium nitride semiconductor is expressed as $In_{(I-x)}Ga_xN$ (with $0<x\leq 1$ being met) formed on the insulative substrate 2 as a base made of sapphire or the like by the well-known epitaxial growth method or the like. In the embodiment as shown in FIG. 2, the light emitting diode chip 2 is formed with a buffer layer 2b of for example a gallium nitride semiconductor comprising GaN formed on the sapphire base material 2a by the well-known epitaxial growth method. An n-type semiconductor region 2c of for example a gallium nitride semiconductor comprising GaN is formed on the buffer layer 2b. According to the well-known epitaxial growth method, an active layer 2d of for example a gallium nitride semiconductor comprising InGaN is formed on the n-type semiconductor region 2c. A semiconductor substrate 2e formed on the active layer 2d is a gallium nitride semiconductor provided with for example a p-type semiconductor region comprising GaN. An anode electrode 2f formed on the semiconductor substrate 2e is electrically connected to the p-type semiconductor region exposed on the top of the semiconductor substrate 2e. A cutout 2h is formed in a portion of the active layer 2d and the semiconductor substrate 2e of the p-type semiconductor region to expose the n-type semiconductor region 2c outside. Formed on the n-type semiconductor region 2c is a cathode electrode 2g electrically connected to the n-type semiconductor region 2c.

In the light emitting diode device 20, the bottom surface of the light emitting diode chip 2 is secured to the bottom of the concavity 3a through an adhesive 12 of an adhesive resin containing an inorganic material or of a polymetaloxane or a ceramic. The adhesive resin preferably includes for example an epoxy resin or a silicone resin. The preferable inorganic material to be mixed into the adhesive resin includes silver, aluminum, titanium oxide, silica or the like. Also, if the adhesive 12 comprises a polymetaloxane or a ceramic, it will be able to avoid the deterioration or discoloration of the adhesive resin 12 resulted from the irradiation of the short-wavelength light emitted from the light emitting diode chip 2 preventing the light absorption associated with the deterioration or discoloration. In the present embodiment, not only the discoloration and the light absorption of the adhesive 12 can thus be avoided, but also the light emitting diode device 1 can improve the luminance, in addition to the improvement on the capability of the protective plastic for the light emitting diode chip 2.

In the light emitting diode device 1, the concavity 3a has a depth larger than the height of the light emitting diode chip 2, and the top of the light emitting diode chip 2 secured to the bottom surface 3b of the concavity 3a is positioned inside the principal surface of the concavity 3a so that a sufficient amount of coating material 10 can be formed inside the concavity 3a.

The anode electrode 2f of the light emitting diode chip 2 is electrically connected to the first wire connection 9a formed on the first external terminal 3 through the first lead wire 5. The cathode electrode 2g of the light emitting diode chip 2 is electrically connected to the second wire connection 9b formed on the second external terminal 4 through the second lead wire 6. Therefore, the first external terminal 3 functions as the anode electrode, while the second external terminal 4 functions as the cathode electrode. The first and second lead wires 5, 6 can be easily connected to the anode and cathode electrodes 2f, 2g and first and second wire connections 9a, 9b by the well-known wire bonding technique.

The top and sides of the light emitting diode chip 2 is covered with the coating material 10 disposed inside of the concavity 3a. The coating material 10 is formed from a coating agent or starting material which comprises a solution produced by hydrolyzing and polymerizing a metal alcoxide by the sol-gel technique, a solution containing a ceramic precursor polymer, or a combination of these solutions. These coating agents are excellent in resistance to ultraviolet light and to heat, and will not practically yellow/color under high temperature environment or ultraviolet light. In other words, when the coating material 10 is irradiated with the short-wavelength light generated from the light emitting diode chip 2 for a relatively long period of time, resulting in a temperature rise, the coating material 10 does not produce yellowing/coloring which decays the light emission from the light emitting diode chip 2. While the encapsulant 8 comprises an epoxy resin, which is not so excellent in resistance to ultraviolet light like plastic sealer for prior art light emitting diodes, the coating material 10, which is disposed between the light emitting diode chip 2 and the encapsulant 8, demonstrates excellent in resistance to ultraviolet light, and also effectively prevents the encapsulant 8 from being yellowed/colored by the ultraviolet light. A lens portion 8a is formed on the top of the encapsulant 8 to outwardly converge the light projected from the light emitting diode chip 2 or reflected on the surface of the concavity 3a.

The coating agent to form the coating material 10 is normally in the liquid state, but when heated in air or in oxygen atmosphere, it generates decomposition of the constituents or absorption of the oxygen to form a clear or transparent coating material mainly based on the metaloxane bond of a metallic oxide. Powder of a fluorescent substance la is mixed in the coating agent, and the mixture is applied to the periphery of the light emitting diode chip 2 so that the coating material 10 can be formed containing the fluorescent substance 10a for the light conversion action.

In manufacturing the semiconductor light emitting device as shown in FIG. 1, the concavity 3a is formed in either end portion of the external terminals 3, 4, and the semiconductor light emitting element 2 is secured to the bottom 3b of the concavity 3a. Then, the electrodes 2f, 2g are electrically connected to the pair of external terminals 3, 4 by means of the lead wires 5, 6. Subsequently, the coating agent comprising a metal alcoxide or a ceramic precursor polymer is poured into the concavity 3a to cover the semiconductor light emitting element 2, the electrodes 2f, 2g and the end portions of the lead wires 5, 6 connected to the electrodes 2f, 2g. This coating agent contains the fluorescent substance 10a for absorbing the light projected from the semiconductor light emitting element 2 to convert it into light different in wavelength from the emitted light. Thereafter, the coating agent is baked to form the coating material 10, which is further sealed with the plastic encapsulant 8. The coating material 10 tightly and strongly adheres to the semiconductor light emitting element 2 and the external terminals 3, 4.

In the light emitting diode device 20, the light emitting diode chip 2 secured to the concavity 3a is covered with the coating material 10 containing the fluorescent substance 10a, and further with the plastic encapsulant 8. In manufacturing, the coating agent containing the fluorescent substance 10a is poured into the concavity 3a from above the light emitting diode chip 2, and baked at a temperature of approximately 150° C. to 200° C. to solidify and form the coating material 10 containing the fluorescent substance 10a, which is followed by sealing the entire end portions of the external terminals 3, 4 with the clear plastic encapsulant 8. The baking temperature for the coating material 10 is sufficiently lower than the melting point of the light emitting diode chip 2.

When a voltage is applied across the external terminals 3, 4 of the light emitting diode device 20, the light emitting diode chip 2 is energized to emit light. The fluorescent substance 10a in the coating material 10 converts a part or the whole of the light into light different in wavelength from the emitted light, and then, the light is converged by the lens portion 8a formed in the end portion of the plastic encapsulant 8 and is released out of the light emitting diode device 20. For example, the semiconductor light emitting element may include a GaN blue light emitting diode chip 2 of a light peak wavelength between approximately 440 am through approximately 470 nm, and the fluorescent substance 10a may include YAG (Yttrium Aluminum Garnet) and an activator of added Ce (cerium). YAG has the chemical formula: $Y_3Al_5O_{12}$ for generating yellow green light with an excitation peak wavelength of approximately 450 nm and a light peak wavelength of approximately 540 nm.

The coating material 10 is prepared by mixing a proper quantity of powdery fine crystal grains of the YAG fluorescent substance 10a with the coating agent to make a liquid mixture; pouring the coating agent into the concavity 3a; and then baking it.

On the other hand, the plastic encapsulant 8 is formed by pouring a liquid-state clear or transparent epoxy resin into a mold; dipping into the epoxy resin the end portions of the external terminals 3, 4 which the light emitting diode chip 2, the lead wires 5, 6, and the coating material 10 are already secured, and retaining them in position in the epoxy resin by means of the positioning jig; and heating and curing the epoxy resin. A light scattering material or a binder 10b, such as powdered silica, may be mixed into the plastic encapsulant 8 as needed to widen the beam spread angle of the light emitted from the light emitting diode device 20 to the outside. The present embodiment can accomplish a bright light emitting diode device with the high effective wavelength conversion efficiency because the maximum value of wavelength conversion efficiency for the YAG fluorescent substance 10a is relatively high, and also the emission light wavelength for the light emitting diode chip 2 practically coincides with the excitation wavelength for the YAG fluorescent substance 10a at the peak of approximately 450 nm. As the crystal grains of the YAG fluorescent substance 10a are dispersed in the coating material 10, the light emitted from the light emitting diode device 20 to the outside contains the original emission light component and the light component wavelength-converted by the fluorescent substance 10a. The original emission light component of the light component projected from the light emitting diode chip 2 is not penetrated through the crystal grains of the fluorescent substance 10a without wavelength-conversion.

Therefore, white light is emitted from the light emitting diode device 20 to the outside as a result of the mixture of the light component from the light emitting diode chip 2 and the light component from the YAG fluorescent substance 10a because the light emitting diode chip 2 provides blue light of a light peak wavelength ranging between approximately 440 nm and approximately 470 nm, and the YAG fluorescent substance 10a provides yellow green light of a light peak wavelength of approximately 540 nm and a wide wavelength distribution of 130 nm in fill width at half maximum. In this case, the tone of the emission light color for the light emitting diode device 20 can be adjusted by controlling the powder amount of the YAG fluorescent substance 10a mixed into the coating agent to vary the distribution density in the coating material 10. Further, the emission light color for the light emitting diode device 20 can be adjusted to a further different tone by adding a proper amount of an appropriate additive in manufacturing the YAG fluorescent substance 10a to partially change the crystal structure and shift the emission light wavelength distribution. For example, the light wavelength distribution can be shifted toward the shorter wavelength area by adding Ga (gallium) or Lu (lutetium), while it can be shifted toward the longer wavelength area by adding Gd (gadolinium).

In the above embodiment, the fluorescent substance 10a is mixed into the coating material 10, however, no fluorescent substance may be mixed into the coating material 10. In this case, the light projected from the light emitting diode chip 2 is released out of the encapsulant 8 without wavelength-conversion and attenuation or decay of the light.

In the present invention, a variety of improvements can be performed to further better the optical characteristics and the workability. For example, the light amount from the light emitting diode chip 2 can be increased to hit the fluorescent substance 10a by mixing a light scattering material into the coating material 10 to scatter the light from the light emitting diode chip 2 in order to improve the wavelength conversion efficiency and widen the beam spread angle of the light released from the light emitting diode device 20 to the outside. In addition, a binder can be compounded to prevent crack initiation in the coating material 10. The viscosity of the coating agent can be raised, and the used quantity of the coating agent can be decreased. To this end, as shown in FIG. 8, an appropriate amount of silica, titanium oxide, or other ceramic powder 10b is preferably mixed into the coating agent accordingly together with powder of the fluorescent substance 10a.

The formed coating material 10 provides not only the light conversion action, but also the following excellent characteristics.

[1] Yellowing or discoloration of the encapsulant 8 can be prevented with use of the coating material 10.

[2] A relatively inexpensive material can be used to perform resin-sealing or form the encapsulant 8 by the potting method or transfer mold method at the lowered manufacturing cost.

[3] A semiconductor light emitting device of short wavelength can be realized at a lower cost, compared to the light emitting device of a hermetic seal structure.

[4] A practical semiconductor light emitting device of short wavelength can be realized.

[5] The coating material 10 weakens only a little amount of light.

[6] The reflection at the boundary surface of the light emitting diode chip 2 can be reduced compared to the hermetic seal structure because the difference in refractive index between the light emitting diode chip 2 and the coating material 10 is relatively small.

[7] Improvement can be made of the light taking-out efficiency for the light emitted from the light emitting diode chip 2.

[8] The light emitting diode device 20 has its excellent moisture resistance to effectively inhibit moisture from permeating the inside in order to prevent debasement of the semiconductor light emitting element 2 and the fluorescent substance 10a.

[9] The semiconductor light emitting element 2 is not deteriorated by any harmful ions from the outside of the semiconductor light emitting element and the fluorescent substance 10a because of the high ion barrier effect to bar permeation of the harmful ions.

[10] The environmental resistance of the light emitting diode device 20 is further improved due to the double protections of the coating material 10 and the encapsulant 8 of the semiconductor light emitting element 2.

[11] The light emission of the semiconductor light emitting element 2 is not decayed because the coating material 10 has its excellent resistances to ultraviolet light and heat 80 that it does not yellow or color under high temperature environment or ultraviolet light.

[12] The coating material 10 offers a good adhesion to the semiconductor light emitting element 2, the external terminals 3, 4, and the oxide inorganic fluorescent substance 10a because the metallic atoms in the coating material 10 strongly bind with the oxygen atoms in the surface oxide layer of the metal or a ceramic.

Thus, the utilization of the coating material 10 can overcome the various drawbacks of the prior art semiconductor light emitting device so that highly reliable semiconductor light emitting device of the wavelength conversion capability can be manufactured at a low-cost.

In addition, the coating agent comprising a metal alcoxide or a ceramic precursor polymer can be poured into the concavity Ba, and can be baked at a temperature of about 150° C. which is lower than the melting point of the light emitting diode chip 2 to allow formation of the coating material 10 in the low temperature region. Therefore, the coating material 10 can be easily formed by using a dripping or other method to supply the liquid-state coating agent into the concavity Sa to which the light emitting diode chip 2 is scoured, and then subjecting the coating agent to a heat treatment, such as baking. The baking temperature for the coating material 10 is sufficiently lower than the melting point of the light emitting diode chip 2.

The coating material 10 filled in the concavity Sa covers the periphery of the light emitting diode chip 2, and the connections of the first lead wire 5 and the second lead wire 6 with the light emitting diode chip 2. Since the top of the light emitting diode chip 2 is positioned below an upper end 3d of the concavity 3a, the light emitting diode chip 2 can be sealed with the coating material 10 of its sufficient thickness. Because the metallic atoms in the coating material 10 strongly bind with the oxygen atoms in the surface oxide layer of the metal or the ceramic, the coating material 10 offers a good adhesion to the semiconductor light emitting element 2, the first external terminal 3, and the second external terminal 4.

The encapsulant 8 is a plastic sealer which comprises an epoxy resin or the like, having a light permeability, and can be easily formed by the well-known potting method, transfer mold method, or the like. The encapsulant 8 may be yellowed/colored by the ultraviolet light generated from the light emitting diode chip 2 without the coating material 10 between the light emitting diode chip 2 and the encapsulant 8. Accordingly, the encapsulant 8 will not practically be yellowed/colored by the ultraviolet light due to the existance of the coating material 10. Consequently, the ultraviolet light emitted through the coating material 10 can be led through and to the outside of the encapsulant 8 without so much decay of the light.

FIG. 3 shows a second embodiment according to the present invention applied to a chip-type light emitting diode device 20 using an insulative substrate. The chip-type light emitting diode device 20 comprises an insulative substrate 11 for providing a base formed with a concavity 3a on one principal surface thereof; a first and second external terminals 3, 4 formed separately from each other on the insulative substrate 11; a light emitting diode chip 2 secured to the concavity 3a of the first external terminal 3 through an adhesive 12; a first lead wire 5 for electrically connecting the anode electrode 2f of the light emitting diode chip 2 with the first external terminal 3, and a second lead wire 6 for electrically connecting the cathode electrode 2g of the light emitting diode chip 2 with the second external terminal 4; a coating material 10 filled in the concavity 3a to cover the light emitting diode chip 2, the anode electrode 2f, the cathode electrode 2g, and the end portions of the lead wires 5, 6 connected to the anode electrode 2f and the cathode electrode 2g; and an encapsulant 8 having a trapezoidal section formed on one principal surface of the insulative substrate 11 for covering the outside of the coating material 10. Each one end of the first and second external terminals 3, 4 is disposed inside the concavity 3a. The light emitting diode chip 2 is secured to the first external terminal 3 through the adhesive 12 at the bottom 3b of the concavity 3a. Each other end of the first and second external terminals 3, 4 extends along the opposite side to the other principal surface of the insulative substrate 11. The coating material 10 is not protruded from the upper end 3d of the concavity 3a. The coating material 10 is further sealed with the plastic encapsulant 8, and the light projected from the semiconductor light emitting element 2 permeates the coating material 10 before being released to the outside of the plastic encapsulant 8.

The light projected from the semiconductor light emitting element 2 reaches the coating material 10, and a part thereof is wavelength-converted into light different in wavelength, and then the converted light is mixed with the wavelength-unchanged light component from the semiconductor light emitting element 2, to release the mixed light to the outside through the plastic encapsulant 8. An additive may be compounded into the coating material 10 such as a light absorption substance for absorbing emitted light of a specific wavelength, a light scattering substance 10b for scattering the light emitted from the semiconductor light emitting element 2, or a binder 10b for preventing the coating material 10 from being cracked. Also in the light emitting diode device 20, the coating material 10 is formed between the light emitting diode chip 2 and the encapsulant 8 to effectively prevent the encapsulant 8 from being yellowed/colored by the ultraviolet light because of the excellent resistance to ultraviolet light of the coating material 10.

In manufacturing a semiconductor light emitting device comprising the insulative substrate 11, the concavity 3a is formed in one principal surface of the insulative substrate 11, and then the pair of external terminals 3. 4 is formed extending in the directions opposite to each other along the one principal surface of the insulative substrate 11, and thereafter, the semiconductor light emitting element 2 is secured to either of the pair of external terminals at the bottom 3b of the concavity 3a.

For example, a GaN light emitting diode chip 2 generates ultraviolet light having a light peak wavelength of approximately 365 nm to approximately 400 nm, and a $Y_2SiO_6$ fluorescent substance 10a provides an excitation peak wavelength of approximately 360 nm, and a light peak wavelength of approximately 549 nm, when activated by means of Ga and Tb (terbium). If the green light emitting diode device 20 includes the GaN light emitting diode chip 2 and $Y_2SiO_5$ fluorescent substance 10a, it generates an extremely sharp emission light distribution of approximately 12 nm in full width at half maximum.

The above-mentioned combination of the light emitting diode chip with the fluorescent substance 10a is only an example, and any fluorescent substance 10a may be used, if it has an excitation wavelength distribution suitable for the light wavelengths for the ultraviolet light emitting diode chip 2 with a high wavelength conversion efficiency. For example, the fluorescent substance 10a of desired characteristics can be selected from groups of the fluorescent substances 10a consisting of the halo calcium phosphate, calcium phosphate, silicate, aluminate, and tangstate.

As stated above, in the present invention, the semiconductor light emitting element is covered with a coating material comprising a glass material which has excellent resistances to ultraviolet light and to heat. Accordingly, the semiconductor light emitting device according to the present invention can suppress deterioration of the coating material and prevent permeation of harmful substances with the high reliability and good light taking-out efficiency. Further, if a fluorescent substance is mixed into the coating material, the semiconductor light emitting device can realize the effective light wavelength conversion capability at a low-cost.

What is claimed is:

1. A semiconductor light emitting device comprising a base having first and second external terminals, a semiconductor light emitting element secured to said base, and a light-permeable coating material for covering said semiconductor light emitting element, said semiconductor light emitting element comprising electrodes electrically connected respectively to said first and second external terminals, wherein said coating material is selected from one of the following:
(1) a glass of a polymetaloxane formed mainly based on the metaloxane bond from a metal alcoxide,
(2) a gel of a polymetaloxane formed from a metal alcoxide, and
(3) a ceramic formed from a polysilazane as a ceramic precursor; and said coating material tightly and strongly adheres directly to the semiconductor light emitting element and electrodes.

2. A semiconductor light emitting device of claim 1, wherein said metal alcoxide is of one or more type selected from a single-metal alcoxide, a two-metal alcoxide and a multi-metal alcoxide.

3. A semiconductor light emitting device of claim 1, wherein ceramic of said coating material is formed by applying a heat treatment to the ceramic precursor.

4. A semiconductor light emitting device of claim 1, wherein said coating material covers all the surfaces of said semiconductor light emitting element excluding the bottom surface thereof.

5. A semiconductor light emitting device of claim 1, wherein said base has a concavity filled with said coating material.

6. A semiconductor light emitting device of claim 1, wherein said base is an insulative substrate or a lead frame.

7. A semiconductor light emitting device of claim 1, wherein said semiconductor light emitting element emits light at light wavelengths of 365 nm to 550 nm.

8. A semiconductor light emitting device of claim 7, wherein said semiconductor light emitting element comprises a gallium nitride compound semiconductor light emitting element.

9. A semiconductor light emitting device of claim 1, wherein said coating material contains a fluorescent substance for receiving at least a part of the light projected from said semiconductor light emitting element to perform wavelength-conversion of the light.

10. A semiconductor light emitting device of claim 9, wherein said fluorescent substance absorbs at least a part of the light projected from said semiconductor light emitting element, and emits light having a wavelength longer than that of the light projected.

11. A semiconductor light emitting device of claim 10, wherein the light projected from said semiconductor light emitting element is mixed with the light wavelength-converted by said fluorescent substance to release the mixed light out of said coating material.

12. A semiconductor light emitting device of claim 1, wherein said coating material is covered with an encapsulant.

13. A semiconductor light emitting device of claim 12, wherein said encapsulant is formed of a plastic which contains a light scattering material or a binder.

14. A semiconductor light emitting device of claim 13, wherein the light projected from said semiconductor light emitting element permeates said coating material before being released to the outside of said encapsulant.

15. A semiconductor light emitting device of claim 14, wherein said encapsulant is fitted into said concavity, and said coating material is formed between the bottom surface of said concavity and said encapsulant.

16. A semiconductor light emitting device of claim 1, wherein a concavity is formed in one principal surface of an insulative substrate for constituting said base; said semiconductor light emitting element is secured to the bottom surface of the concavity; and a pair of said electrodes in said semiconductor light emitting element is electrically connected to a pair of said external terminals formed on the one principal surface of said insulative substrate.

17. A semiconductor light emitting device of claim 1, wherein a lead frame for constituting said base has a pair of said external terminals; a concavity is formed in either of said external terminals; said semiconductor light emitting element is secured to the bottom surface of the concavity.

18. A semiconductor light emitting device comprising a base having first and second external terminals, a semiconductor light emitting element secured to said base, and a light-permeable coating material for covering said semiconductor light emitting element, said semiconductor light emitting element comprising electrodes electrically connected respectively to said first and second external terminals, wherein said coating material is selected from one of the following:
(1) a glass of a polymetaloxane formed mainly based on the metaloxane bond,
(2) a gel of a polymetaloxane, and
(3) a ceramic formed from a ceramic precursor, and said coating material directly adheres to the semiconductor light emitting element and electrodes, said semiconductor light emitting element is secured to said base by an adhesive of the same material as that of said coating material.

* * * * *